United States Patent [19]

Yoshida

[11] Patent Number: 5,516,704
[45] Date of Patent: May 14, 1996

[54] METHOD AND AN APPARATUS FOR MANUFACTURING THIN-FILM PHOTOELECTRIC CONVERSION MODULES

[75] Inventor: Takashi Yoshida, Kawasaki, Japan

[73] Assignee: Fuji Electric Co., Ltd., Hino, Japan

[21] Appl. No.: 415,525

[22] Filed: Apr. 3, 1995

[30]  Foreign Application Priority Data

Apr. 1, 1994 [JP] Japan .................................. 6-064285

[51] Int. Cl.$^6$ .................................................. H01L 31/18
[52] U.S. Cl. ................ 437/2; 136/251; 156/64;
156/256; 156/269; 156/272.2; 156/301;
156/302; 156/308.2; 156/324; 156/363;
156/378; 156/517; 156/519; 156/520; 156/552;
156/558; 437/8; 437/51; 437/205; 437/207;
437/209; 437/219
[58] Field of Search ..................... 437/2–5, 8, 51,
437/205, 207, 209, 219; 136/251; 156/64,
256, 261, 264, 265, 267, 269, 272.2, 301–302,
308.2, 324, 363, 378, 517–520, 552, 558

[56]  References Cited

U.S. PATENT DOCUMENTS

| | | |
|---|---|---|
| 4,149,665 | 4/1979 | Costogue et al. . |
| 4,450,033 | 5/1984 | Little ..................................... 156/380.8 |
| 4,773,944 | 9/1988 | Nath et al. ............................... 136/249 |
| 5,092,939 | 3/1992 | Nath et al. ............................... 136/251 |
| 5,133,810 | 7/1992 | Morizane et al. ....................... 136/251 |
| 5,273,608 | 12/1993 | Nath ........................................ 156/301 |

FOREIGN PATENT DOCUMENTS

| | | | |
|---|---|---|---|
| 0111394 | 6/1984 | European Pat. Off. ............... 136/251 |
| 2042802 | 9/1980 | United Kingdom .................... 136/251 |
| WO94/22172 | 9/1994 | WIPO ..................................... 136/251 |

*Primary Examiner*—Aaron Weisstuch
*Attorney, Agent, or Firm*—Brumbaugh, Graves, Donohue & Raymond

[57]  ABSTRACT

Multiple thin-film photoelectric conversion elements formed on a flexible insulating substrate are organized as a single photoelectric conversion module via a manufacturing process that substantially eliminates the probability of damaging the light-receiving surface of the photoelectric conversion elements during the manufacturing process. Each photoelectric conversion element includes a rear electrode layer, a photoelectric conversion layer, and a transparent electrode layer laminated on one side of a substrate, and an auxiliary connecting electrode layer formed on the other side of the substrate. The manufacturing process for the conversion module involves utilizing an apparatus which includes two perpendicularly overlapping belt systems and a cutting/heating unit. The first belt system applies a thermally adhesive resin film to the light-receiving surface of the conversion elements mounted on a substrate. The cutting/heating unit identifies and cuts out non-defective conversion elements. The cutting/heating unit also affixes one surface of the cut out conversion element to a transparent protective film dispensed by the second belt system. The second belt system also applies a conductive material to the other surface of the cut out conversion element, thereby connecting the auxiliary connecting electrode layers of the discrete conversion elements. Finally, the second belt system applies a transparent protective film on top of the conductive material and the auxiliary connecting electrode layer.

20 Claims, 3 Drawing Sheets

METHOD AND AN APPARATUS FOR MANUFACTURING THIN-FILM PHOTOELECTRIC CONVERSION MODULES

BACKGROUND OF THE INVENTION

The present invention relates generally to a method and an apparatus for manufacturing thin-film photoelectric conversion modules, and relates more particularly to a method and an apparatus for manufacturing thin-film photoelectric conversion modules which are protected on both major surfaces by sandwiching a plurality of thin-film photoelectric conversion elements disposed on a flexible substrate between flexible weatherproof films.

A prior art thin-film photoelectric conversion element in which a rear electrode layer, a photoelectric conversion layer and a transparent electrode layer are disposed, in that order, on a substrate is known from a Japanese patent disclosure No. HEI 5-72113. In this prior art photoelectric conversion element, the rear electrode layer, the photoelectric conversion layer, and the transparent electrode layer are arranged such that the photoelectric conversion element converts light admitted from the transparent electrode layer side into electric power. Further, each layer of this prior art photoelectric conversion element is separated from the adjacent layers by using different patterning methods before a subsequent layer is formed, thereby creating a series-connection structure.

Also known in the prior art is a method of "modularizing" multiple photoelectric conversion elements into one conversion module by electrically connecting the individual conversion elements via connecting conductors and covering both sides of the conversion elements with protective films. In this manner, the photoelectric conversion elements are protected from the influence of ambient moisture and gases. This prior art method is disclosed in the Japanese patent disclosure No. HEI 5-59591.

In the above-described prior art embodiments, connections for modularization are accomplished by using exposed portions on the rear electrode layer and the transparent electrode layer of the substrate. Therefore, the electrode layer must be kept exposed until the bonding process is completed and, as a result, its surface cannot be protected during the bonding process. This drawback leads to, among other things, defects caused by changes in surface properties during the manufacturing process, and a breakdown of the photoelectric conversion elements when the element characteristics are being measured. In addition, if a plastic film used as the flexible substrate is extremely thin, the manufacturing process is further complicated by the need for the fragile film to be handled with extreme care when it is divided into a sub-module size from a film roll.

SUMMARY OF THE INVENTION

In order to remedy the above-described deficiencies of the prior art, a thin-film photoelectric conversion element described in the U.S. Pat. No. 5,421,908, which is assigned to the assignee of the present application, incorporates an auxiliary connecting electrode layer disposed on a surface of a flexible substrate opposite to the surface on which the transparent electrode layer is disposed, which auxiliary connecting layer is connected to the rear electrode layer or the transparent layer through connecting holes in the substrate. The auxiliary connecting electrode layer makes it possible to interconnect thin-film photoelectric conversion elements. Since there is no connection to the light-receiving side of the substrate, defects and element breakdown can be prevented, and the substrate, if thin, can be reinforced by covering it with a protective film.

The present invention provides a method and an apparatus for manufacturing thin-film photoelectric conversion modules incorporating several of the above-described thin-film photoelectric conversion elements. The method includes a preliminary step of forming on a first surface of an insulating film or substrate a series of thin-film photoelectric conversion elements by laminating, in sequence, a rear electrode layer, a photoelectric conversion semiconductor layer and a transparent electrode layer, and forming an auxiliary connecting electrode layer on a second surface of the insulating substrate. One region of the auxiliary connecting electrode layer is connected to the rear electrode layer, while another region of the auxiliary connecting electrode layer is connected to the transparent electrode layer, both through the connecting holes (or through holes) in the substrate. Other than the connections through the connecting holes, the rear electrode layer, the auxiliary connecting electrode layer and the transparent electrode layer are insulated from each other.

The method according to the present invention also includes measuring the characteristics of each photoelectric conversion element to identify defective ones, and covering the surface of the transparent-electrode-layer side of each photoelectric conversion element with a transparent, thermally-adhesive resin film. 'Next', selective regions of the insulating substrate, on which non-defective photoelectric conversion elements and the thermally-adhesive resin film are disposed, are cut out.

Following the above steps, a transparent protective film is heat laminated via the thermally-adhesive resin on the cut-out photoelectric conversion elements. In addition, the individual photoelectric conversion elements forming the conversion module are interconnected by connecting the auxiliary connecting electrode layer on the second surface of the insulating substrate via electrical conductors. Finally, a protective film is heat laminated over the second surface of the insulating substrate, i.e., over the auxiliary connecting electrode layer, via another thermally-adhesive resin film.

The above-mentioned transparent, thermally-adhesive resin should preferably have a thickness of 100 µm or less. The above-mentioned electrical conductors used to make the connection amongst discrete photoelectric conversion elements should preferably be an electrically conductive tape soldered onto the auxiliary connecting electrode layer. Alternatively, the electrical conductors may be a printed and hardened, electrically conductive paste.

An apparatus for manufacturing thin-film photoelectric conversion modules according to the above-described method includes two intersecting, perpendicular belt systems and a cutting/heating unit positioned at the point of intersection of the two belt systems. The first belt system consists of two vertically separated delivery rollers, a pair of heating rollers laterally removed from the delivery rollers, and a take-up roller. One of the two delivery rollers dispenses a flexible insulating substrate mounted with a series of discrete thin-film photoelectric conversion elements described above, and the other delivery roller dispenses a transparent, thermally-adhesive resin film. The pair of heating rollers bond the transparent, thermally-adhesive resin film to the surface of the insulating substrate on which the transparent electrode layer of the discrete photoelectric conversion element is disposed.

The second belt system, which is oriented substantially perpendicular to the first belt system, consists of a first combination of a delivery roller and a system take-up roller for dispensing a first transparent, protective film; a second combination of a delivery roller and the system take-up roller for dispensing a second thermally-adhesive resin film; a roller mechanism for affixing the connecting conductors onto the auxiliary electrodes of the discrete photoelectric conversion elements; and a third combination of a delivery roller and the system take-up roller for dispensing a second protective film.

The cutting/heating unit sandwiches the two belt systems at the point of intersection of the two "belts" such that the take-up roller of the first belt system winds the insulating substrate that remains after the cutting mechanism of the cutting/heating unit has cut out the insulating substrate regions mounted with non-defective photoelectric conversion elements and the thermally adhesive film. Once the discrete photoelectric conversion element has been cut out from the first belt system, the first transparent, protective film dispensed by the second belt system is bonded to one surface of the conversion element. Thereafter, the connecting conductors are applied to the auxiliary connecting electrodes of the conversion elements to electrically connect the individual conversion elements. Finally, the second protective film is laminated on top of the connecting conductors and the auxiliary connecting electrode layer. The finished photoelectric conversion modules are wound on the system take-up roller.

The above-described roller-mechanism to affix the connecting conductors should preferably be a heating roller that can solder the electrically conductive tape having a solder-coated surface onto the auxiliary connecting electrodes. Alternatively, the roller mechanism may be a roller coater that can apply electrically conductive paste and an ultraviolet ray source to harden the electrically conductive paste.

By utilizing the above-described manufacturing apparatus and method, the light-receiving surface of photoelectric conversion elements can be protected, and the thin, flexible substrate can be reinforced before the thin-film photoelectric conversion elements are connected and modularized into a single photoelectric conversion module. Additionally, since the present invention facilitates the selection of only non-defective photoelectric conversion elements for incorporation into the larger photoelectric conversion module, the manufacturing efficiency of non-defective photoelectric conversion module is improved.

It is an object of the present invention to provide a method for manufacturing thin-film photoelectric conversion modules incorporating multiple thin-film photoelectric conversion elements each having an auxiliary connecting electrode layer on the rear of the substrate.

It is another object of the present invention to provide an apparatus for manufacturing thin-film photoelectric conversion modules incorporating multiple thin-film photoelectric conversion elements each having an auxiliary connecting electrode layer on the rear of the substrate.

It is yet another object of the present invention to provide a method for manufacturing thin-film photoelectric conversion modules, which method minimizes damage to the light-receiving surface of the component photoelectric conversion elements during the manufacturing process.

It is still another object of the present invention to provide an apparatus for manufacturing thin-film photoelectric conversion modules, which apparatus minimizes damage to the light-receiving surface of the component photoelectric conversion elements during the manufacturing process.

BRIEF DESCRIPTION OF THE DRAWINGS

FIG. 4($b$) is a plan view of another type of electrically conductive tape used in a method according to one embodiment of the present invention.

DETAILED DESCRIPTION OF THE INVENTION

Figure 1:
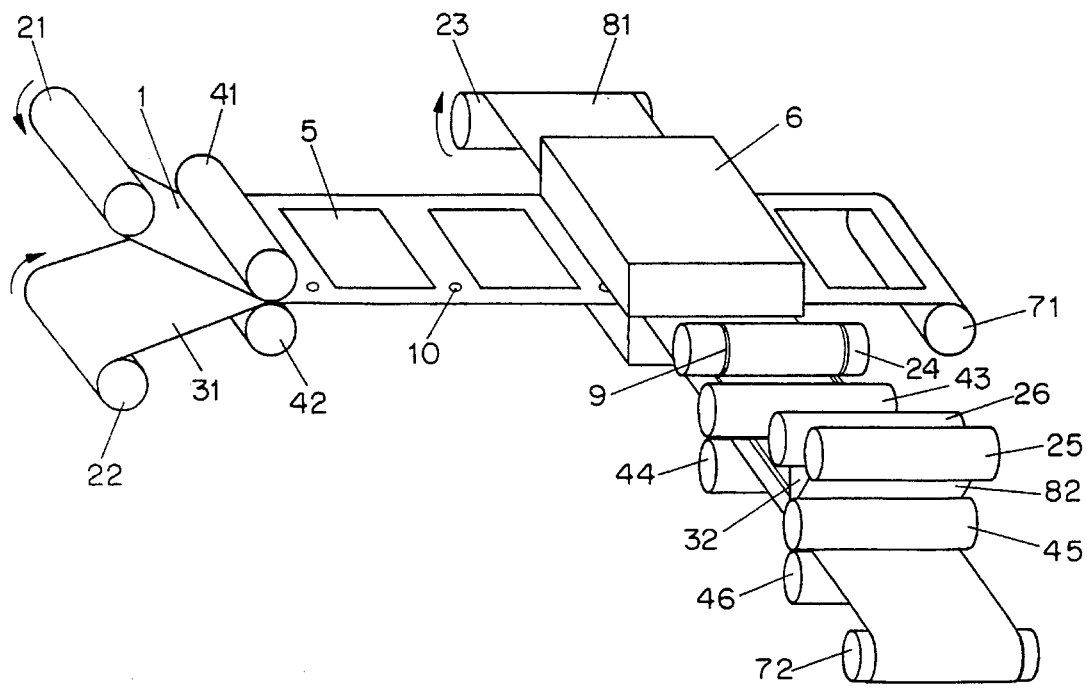
FIG. 1 is a perspective view of an apparatus according to one embodiment of the present invention used to manufacture thin-film photoelectric conversion modules.

As shown in FIG. 1, first preferred embodiment of an apparatus for manufacturing thin-film photoelectric conversion module according to the present invention incorporates two perpendicularly oriented belt systems and a cutting/heating unit positioned at the point of intersection of the two belt systems. A first belt system incorporates a delivery roller 21 for dispensing an insulating flexible film 1 on which discrete photoelectric conversion elements 5 are mounted, a delivery roller 22 for dispensing a transparent, thermally-adhesive resin film 31, two juxtaposing heating rollers 41 and 42 for thermally bonding the insulating film 1 to the thermally-adhesive resin by sandwiching them, and a take-up roller 71.

The insulating flexible film 1 may be, for example, a polyethylene naphthalate (PEN) film. The thermally-adhesive resin film 31 may be, for example, an ethylene-vinyl acetate (EVA) film, a polyvinyl acetate (PVA) film, or a polyolefin-based film. The photoelectric conversion elements 5 are mounted on the insulating flexible film (also referred to as "insulating substrate") by laminating, in sequence, a rear electrode layer, a photoelectric conversion semiconductor layer and a transparent electrode layer on a first surface of the insulating substrate, and forming an auxiliary connecting electrode layer on a second surface of the insulating substrate. One region of the auxiliary connecting electrode layer is connected to the rear electrode layer, while another region of the auxiliary connecting electrode layer is connected to the transparent electrode layer, both through the connecting holes (or through holes) in the substrate. Other than the connections through the connecting holes, the rear electrode layer, the auxiliary connecting electrode layer, and the transparent electrode layer are insulated from each other. The thin-film photoelectric conversion element of this type is described in detail in the U.S. Pat. No. 5,421,908, assigned to the assignee of the present application.

A second belt system, which is oriented substantially perpendicular to the first belt system and intersects the first belt system at the cutting/heating unit 6, incorporates a delivery roller 23 for dispensing a transparent protective (weatherproof) film 81. The cutting/heating unit 6, upon detection of the position of a given photoelectric conversion element 5 indicated by a marker 10, punches out the photoelectric conversion element 5 and thermally bonds the transparent electrode side (the first surface of the insulating substrate) of the conversion element to the weatherproof film 81.

The second belt system also incorporates a delivery roller 24 for dispensing an electrically conductive tape 9 coated with solder, and two juxtaposing heating rollers 43 and 44 that connect the electrically conductive tape 9 to the auxiliary connecting electrodes on the second surface (rear) of the insulating flexible film 1 of the punched-out photoelectric conversion elements 5. The heating rollers 43 and 44 connect the tape 9 to the auxiliary connecting electrodes by melting the solder coated on the surface of the conductive tape, and the heating rollers also thermally fix the tape on the weatherproof film 81. In addition, the second belt system incorporates a delivery roller 25 for dispensing a weatherproof film 82, a delivery roller 26 for dispensing a thermally-adhesive film 32, two juxtaposing heating rollers 45 and 46, and a take-up roller 72. The two juxtaposing heating rollers 45 and 46 thermally bond the weatherproof film 82, via the thermally adhesive film 32, to the second surface of the insulating flexible film 1 of the punched-out photoelectric conversion element 5.

The above-described first embodiment of an apparatus for manufacturing thin-film photoelectric conversion module according to the present invention facilitates fixation of the discrete photoelectric conversion elements 5 onto the weatherproof film 81 without damaging the surfaces of the conversion elements. Since the transparent electrode layer of the thin-film photoelectric conversion elements 5 is coated with the transparent, thermally adhesive resin film 31 before the cutting/heating unit 6 punches out and thermally fixes the discrete conversion elements 5 onto the weatherproof film 81, damage to the transparent-electrode-layer side of the conversion element 5 is minimized. Furthermore, because the first and second belt systems implement a continuous roll-to-roll manufacturing process, individual movement of the discrete conversion elements 5 mounted on the substrate 1 is eliminated. Additionally, because the discrete conversion elements 5 mounted on the substrate 1 are affixed to the weatherproof film 81, both the wiring of the electrically conductive tape 9 and fixation of the weatherproof film 82 onto the second surface (rear) of the insulating flexible film 1 via the thermally adhesive resin 32 can be continuously executed by the second belt system implementing the roll-to-roll manufacturing process.

Preferred materials for the weatherproof films 81 and 82 include fluorine-based resin film and transparent plastic films such as polyethylene terephthalate (PET) and polyethylene naphthalate (PEN) films with their surfaces protected by amorphous $SiO_x$:H, amorphous $SiC_x$:H, amorphous $SiN_x$:H, amorphous $SiO_xC_y$:H, amorphous $SiO_xN_y$:H, amorphous C:H, amorphous $CN_x$:H, amorphous $CO_x$:H, $SiN_x$, or $SiO_x$. Although the manufacturing method according to the present invention may utilize component films of different thicknesses, in order to impart flexibility to the completed photoelectric conversion modules to the extent they can be folded, however, each of the substrate film 1, the thermally adhesive films 31 and 32, and the weatherproof films 81 and 82 should preferably have thicknesses of 200 μm or less, and, optimally, 100 μm or less.

Figure 3:
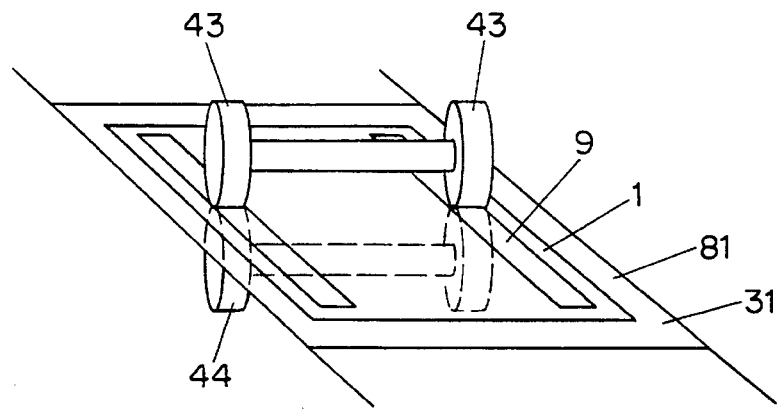
FIG. 3 is a perspective view showing a method of attaching an electrically conductive tape utilized in one embodiment of the present invention.

The heating rollers 43 and 44 used to heat and affix the electrically conductive tape 9 should preferably have a width that substantially matches that of the electrically conductive tape 9 shown in FIG. 3. This requirement arises because, when melting the solder on the electrically conductive tape and depositing it on the auxiliary connecting electrodes of the photoelectric conversion elements 5, a high temperature close to 200° C. is required, and a mismatch between the width of the heating rollers and the width of the conductive tape could result in heat damage to the photoelectric conversion elements.

Figure 4A:
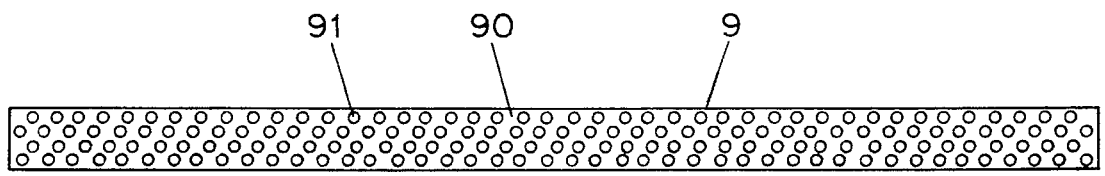
FIG. 4($a$) is a plan view of one type of electrically conductive tape used in a method according to one embodiment of the present invention.
Figure 4B:
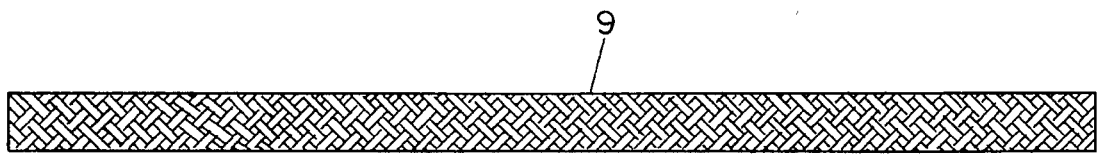

The electrically conductive tape 9 is preferably a copper foil tape with its surface coated with solder. More particularly, a tape made of copper foil 90 drilled with very small holes 91, as shown in FIG. 4(a), or a fibrous copper belt, as shown in FIG. 4(b), may be utilized as the electrically conductive tape 9. The electrically conductive tapes shown in FIGS. 4(a) and 4(b) provide a high sealing performance when the tape surface is subsequently covered by the thermally adhesive resin film 32.

It is preferred that the individual photoelectric conversion elements 5 on the substrate 1 be tested before the substrate is wound around the delivery roller 21, or at least before the conversion elements 5 are covered with the thermally adhesive film 31, and only those conversion elements exhibiting the predetermined characteristics are marked with the position marker 10. In this manner, no defective elements are incorporated into the completed photoelectric conversion module since the cutting/heating unit 6 punches out only those conversion elements 5 mounted on the substrate 1 marked with the position marker 10.

Figure 2:
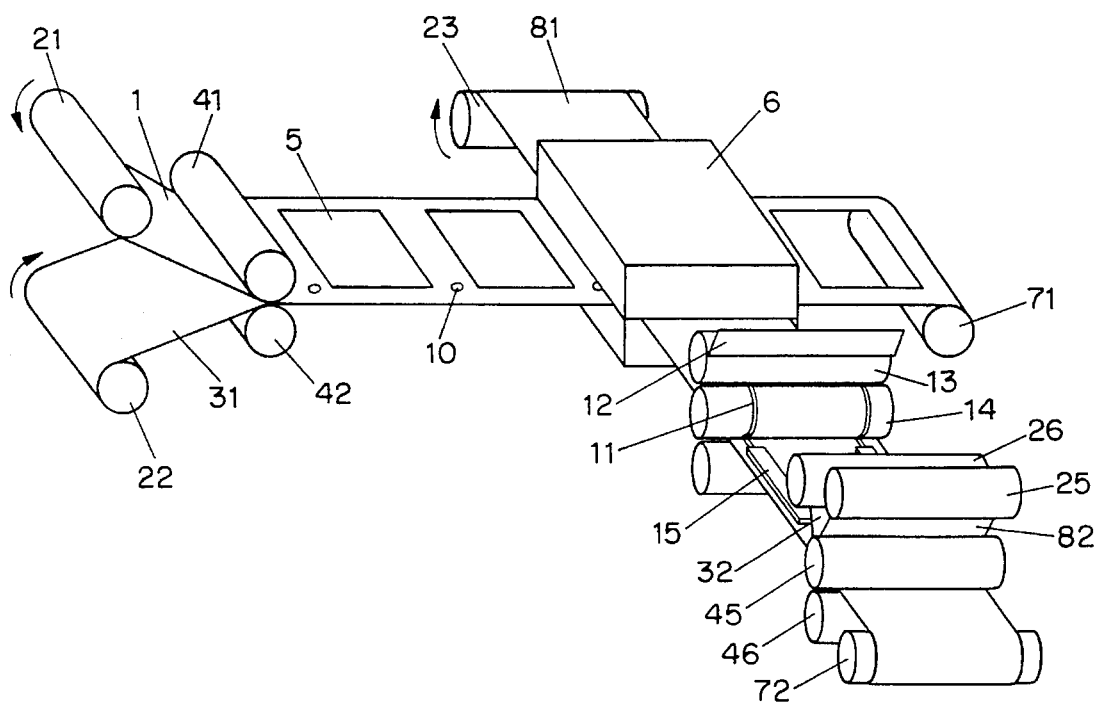
FIG. 2 is a perspective view of an apparatus according to another embodiment of the present invention used to manufacture thin-film photoelectric conversion modules.

As shown in FIG. 2, the second preferred embodiment of the manufacturing apparatus according to the present invention differs from the first preferred embodiment shown in FIG. 1 in that roll coaters 12, 13 and 14 are incorporated instead of the delivery roller 24 which dispenses the electrically conductive tape 9. The roll coaters 12, 13, and 14 are used to coat the surface of the weatherproof film 81, on which the photoelectric conversion elements 5 have been thermally fixed, with electrically conductive paste 11 that is subsequently hardened by using an ultraviolet ray source 15.

The manufacturing method utilizing the second preferred embodiment of the manufacturing apparatus according to the present invention substantially reduces the time and effort required to affix the connecting conductor (conductive paste 11) to the photoelectric conversion elements 5 in comparison with the manufacturing method in which electrically conductive tape 9 is used. The manufacturing method utilizing the second preferred embodiment of the manufacturing apparatus according to the present invention also increases flexibility of the completed photoelectric conversion modules. Furthermore, since the ultraviolet ray source 15 irradiates light from the side of the insulating substrate 1 opposite to the side on which the photoelectric conversion semiconductor layer of the conversion element 5 is disposed, the photoelectric conversion performance of the conversion elements 5 is not affected.

Figure 5:
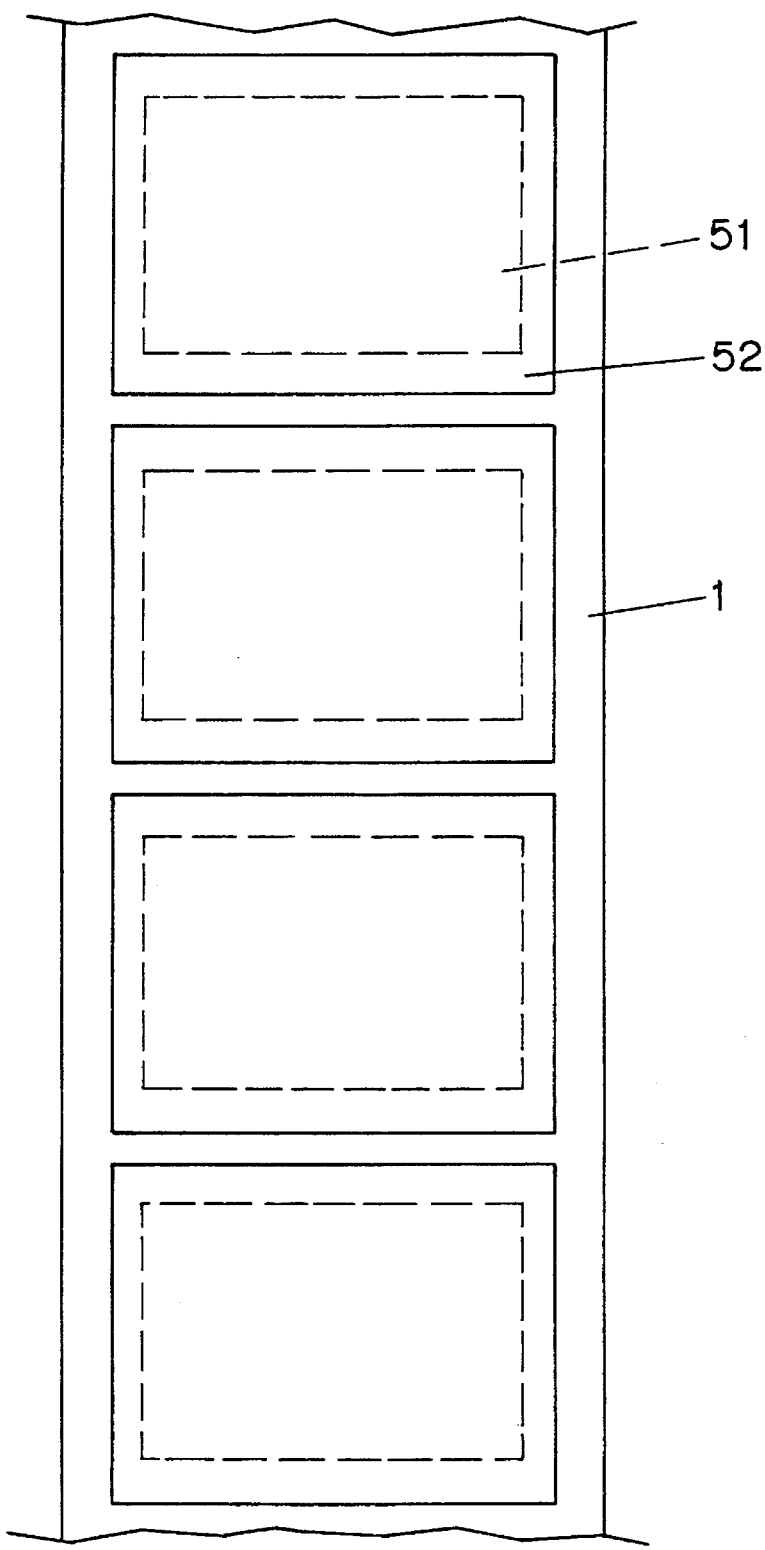
FIG. 5 is a plan view of photoelectric conversion elements disposed on an insulating substrate used in a method according to one embodiment of the present invention.

As shown in FIG. 5, by cutting the discrete photoelectric conversion elements 5 mounted on the flexible film 1 (the insulating substrate) so as to leave a reserve region 52 of 1 mm–50 mm width surrounding a power generation region 51 of the conversion element 5, it becomes possible to detect the positions of the individual photoelectric conversion layers by using a simple position sensor. Furthermore, by leaving the circumferential area 52 around the power generation area 51, the discrete photoelectric conversion elements 5 may be interconnected via the circumferential area 52 in a manner that reduces the thermal effect on the photoelectric conversion elements 5.

As previously mentioned, the cutting position is determined by using the position marker 10 formed on the substrate 1 as shown in FIGS. 1 and 2. Utilizing the position marker 10 enables a manufacturing process in which positional errors due to variations in dimensions of the individual conversion elements do not accumulate with the successive cutting of the discrete conversion elements. The position marker may be a hole drilled by a punching device or a marker that has the reflectance changed by a laser.

While the present invention has been described in connection with specific exemplary embodiments thereof, it will be appreciated by those of ordinary skill in the art that various modifications and alterations may be made to the exemplary embodiments without departing from the spirit or scope of the present invention. For example, although the present invention have been described with reference to copper connector as the connecting conductor, the present invention encompasses other types of conductive materials used as the connecting conductor.

I claim:

1. A method for manufacturing a thin-film photoelectric conversion module having a plurality of thin-film photoelectric conversion elements, each of which elements comprises, in ascending order, a rear electrode layer, a photoelectric conversion semiconductor layer, and a transparent electrode layer disposed on one side of a flexible insulating substrate and an auxiliary connecting electrode layer disposed on the other side of the flexible insulating substrate, one region of the connecting electrode layer being connected to the rear electrode layer via a first connecting hole through the substrate while another region of the auxiliary connecting electrode layer being connected to the transparent electrode layer via a second connecting hole through the substrate, each one of the connecting electrode layer, the rear electrode layer, and the transparent electrode layer being insulated from each other, said method comprising:

forming a plurality of said thin-film photoelectric conversion elements having a common, flexible insulating substrate;

measuring physical characteristics of each photoelectric conversion element to identify photoelectrical conversion elements having predetermined physical characteristics;

laminating on the transparent electrode layer of each photoelectric conversion element a first transparent, thermally-adhesive-resin film common to each of the photoelectric conversion element on the flexible insulating substrate;

cutting out the photoelectric conversion elements having the predetermined physical characteristics, together with the first thermally-adhesive-resin film laminated on the photoelectric conversion elements;

laminating onto the first thermally-adhesive-resin film on each of the cut-out photoelectric conversion elements a first transparent, protective film common to each of the cut-out photoelectric conversion elements;

interconnecting via an electrically conductive material the auxiliary connecting electrode layer of each of the photoelectric conversion elements disposed on the first transparent, protective film;

laminating a second thermally-adhesive-resin film on top of the electrically conductive material and the auxiliary connecting electrode layer of each of the photoelectric conversion elements disposed on the first transparent, protective film, the second thermally-adhesive-resin film being common to each of the photoelectric conversion elements disposed on the first transparent, protective film; and laminating a second protective film on top of the second thermally-adhesive-resin film.

2. The method for manufacturing a thin-film photoelectric conversion module according to claim 1, wherein the first transparent, protective film is laminated on the first thermally-adhesive-resin film by means of heating.

3. The method for manufacturing a thin-film photoelectric conversion module according to claim 2, wherein the second transparent, protective film is laminated on the second thermally-adhesive-resin film by means of heating.

4. The method for manufacturing a thin-film photoelectric conversion module according to claim 3, wherein the step of interconnecting via an electrically conductive material the auxiliary connecting electrode layer of each of the photoelectric conversion elements comprises soldering onto the auxiliary connecting electrode layer an electrically conductive tape.

5. The method for manufacturing a thin-film photoelectric conversion module according to claim 4, wherein the step of laminating on the transparent electrode layer of each photoelectric conversion element a first transparent, thermally-adhesive-resin film comprises:

juxtaposing a first transparent, thermally-adhesive-resin film having a thickness no greater than 100 µm with the transparent electrode layer of the photoelectric conversion element; and heating the first transparent, thermally-adhesive-resin film and the photoelectric conversion element.

6. The method for manufacturing a thin-film photoelectric conversion module according to claim 3, wherein the step of interconnecting via an electrically conductive material the auxiliary connecting electrode layer of each of the photoelectric conversion elements comprises coating at least a portion of the auxiliary connecting electrode connecting layer with an electrically conductive paste and hardening the conductive paste.

7. The method for manufacturing a thin-film photoelectric conversion module according to claim 6, wherein the conductive paste is hardened by applying an ultraviolet ray.

8. The method for manufacturing a thin-film photoelectric conversion module according to claim 7, wherein the step of laminating on the transparent electrode layer of each photoelectric conversion element a first transparent, thermally-adhesive-resin film comprises:

juxtaposing a first transparent, thermally-adhesive-resin film having a thickness no greater than 100 µm with the transparent electrode layer of the photoelectric conversion element; and heating the first transparent, thermally-adhesive-resin film and the photoelectric conversion element.

9. The method for manufacturing a thin-film photoelectric conversion module according to claim 1, wherein the step of forming a plurality of thin-film photoelectric conversion elements having a common, flexible insulating substrate comprises:

forming on a first surface of an insulating substrate, in ascending order, a rear electrode layer, a photoelectric conversion semiconductor layer, and a transparent electrode layer;

forming on a second surface of the insulating substrate an auxiliary connecting electrode layer;

connecting a first region of the auxiliary connecting electrode layer to the rear electrode layer through a first connecting hole in the insulating substrate; and connecting a second region of the auxiliary connecting electrode layer to the transparent electrode layer through a second connecting hole in the substrate.

10. The method for manufacturing a thin-film photoelectric conversion module according to claim 9, wherein the step of interconnecting via an electrically conductive material the auxiliary connecting electrode layer of each of the photoelectric conversion elements comprises soldering onto the auxiliary connecting electrode layer an electrically conductive tape.

11. The method for manufacturing a thin-film photoelectric conversion module according to claim 10, wherein the step of laminating on the transparent electrode layer of each photoelectric conversion element a first transparent, thermally-adhesive-resin film comprises:

juxtaposing a first transparent, thermally-adhesive-resin film having a thickness no greater than 100 μm with the transparent electrode layer of the photoelectric conversion element; and heating the first transparent, thermally-adhesive-resin film and the photoelectric conversion element.

12. The method for manufacturing a thin-film photoelectric conversion module according to claim 9, wherein the step of interconnecting via an electrically conductive material the auxiliary connecting electrode layer of each of the photoelectric conversion elements comprises coating at least a portion of the auxiliary connecting electrode layer with an electrically conductive paste and hardening the conductive paste.

13. The method for manufacturing a thin-film photoelectric conversion module according to claim 12, wherein the conductive paste is hardened by applying an ultraviolet ray.

14. The method for manufacturing a thin-film photoelectric conversion module according to claim 13, wherein the step of laminating on the transparent electrode layer of each photoelectric conversion element a first transparent, thermally-adhesive-resin film comprises:

juxtaposing a first transparent, thermally-adhesive-resin film having a thickness no greater than 100 μm with the transparent electrode layer of the photoelectric conversion element; and heating the first transparent, thermally-adhesive-resin film and the photoelectric conversion element.

15. An apparatus for manufacturing a thin-film photoelectric conversion module having a plurality of thin-film photoelectric conversion elements, each of said thin-film photoelectric conversion elements comprising, in ascending order, a rear electrode layer, a photoelectric conversion semiconductor layer, and a transparent electrode layer disposed on one side of an extended, flexible insulating substrate and an auxiliary connecting electrode layer disposed on the other side of the flexible insulating substrate, one region of the auxiliary connecting electrode layer being connected to the rear electrode layer via a first connecting hole through the substrate while another region of the auxiliary connecting electrode layer being connected to the transparent electrode layer via a second connecting hole through the substrate, each one of the auxiliary connecting electrode layer, the rear electrode layer, and the transparent electrode layer of the thin-film photoelectric conversion element being insulated from each other, said plurality of thin-film photoelectric conversion elements being connected by an electrically conductive element which connects the auxiliary connecting electrode layers of the thin-film photoelectric conversion elements, said plurality of thin-film photoelectric conversion elements being covered on both surfaces by two transparent protective films common to said plurality of thin-film photoelectric conversion elements, said apparatus comprising:

a first roller-to-roller dispensing system having a first dispensing roller for dispensing the flexible insulating substrate mounted with a plurality of thin-film photoelectric conversion elements, a second dispensing roller for dispensing a first transparent, thermally-adhesive-resin film, and a pair of rollers for bonding the transparent electrode surface of the flexible insulating substrate to the first transparent, thermally-adhesive-resin film;

a second roller-to-roller dispensing system having a third dispensing roller for dispensing a first transparent, protective film, said second roller-to-roller dispensing system being oriented so that said first transparent, protective film substantially perpendicularly intersects with the flexible insulating substrate bonded with the first transparent, thermally-adhesive-resin film;

a means for identifying the thin-film photoelectrical conversion elements having predetermined physical characteristics;

a means for cutting out the thin-film photoelectrical conversion elements having predetermined physical characteristics from the extended, flexible insulating substrate bonded with the first transparent, thermally-adhesive-resin film;

a means for bonding the cut-out thin-film photoelectrical conversion elements to the first transparent, protective film so that the first transparent, protective film faces the transparent electrode layer via the first transparent, thermally-adhesive-resin film;

a means for dispensing and bonding an electrically conductive material to the auxiliary connecting electrode layer of the cut-out thin-film photoelectrical conversion elements bonded to the first transparent, protective film; and a means for bonding a second protective film, via a second thermally-adhesive-resin film, on top of the electrically conductive material and the auxiliary connecting electrode layer.

16. The apparatus for manufacturing a thin-film photoelectric conversion module according to claim 15, wherein the means for cutting out the thin-film photoelectrical conversion elements from the extended flexible insulating substrate and the means for bonding the cut-out thin-film photoelectrical conversion elements to the first transparent, protective film are positioned at a location where said first transparent, protective film substantially perpendicularly intersects with the flexible insulating substrate bonded with the first transparent, thermally-adhesive-resin film.

17. The apparatus for manufacturing thin-film photoelectric conversion modules according to claim 16, wherein the means for dispensing and bonding an electrically conductive material to the auxiliary connecting electrode layer of the cut-out thin-film photoelectrical conversion elements comprises:

a roller for dispensing an electrically conductive tape having a solder-coated surface; and a heating mechanism to solder the electrically conductive tape onto the auxiliary electrodes.

18. The apparatus for manufacturing thin-film photoelectric conversion modules according to claim 17, wherein the means for bonding the cut-out thin-film photoelectrical conversion elements to the first transparent, protective film comprises a first pair of juxtaposing heating rollers, and the means for bonding a second protective film on top of the electrically conductive material and the auxiliary connecting electrode layer comprises a second pair of juxtaposing heating rollers.

19. The apparatus for manufacturing thin-film photoelectric conversion modules according to claim 16, wherein the means for dispensing and bonding an electrically conductive material to the auxiliary connecting electrode layer of the cut-out thin-film photoelectrical conversion elements comprises:

a coating means for applying an electrically conductive paste onto the auxiliary connecting electrode layer; and an ultraviolet ray source for hardening the electrically conductive paste.

20. The apparatus for manufacturing thin-film photoelectric conversion modules according to claim 19, wherein the means for bonding the cut-out thin-film photoelectrical conversion elements to the first transparent, protective film comprises a first pair of juxtaposing heating rollers, and the means for bonding a second protective film on top of the electrically conductive material and the auxiliary connecting electrode layer comprises a second pair of juxtaposing heating rollers.

* * * * *